[12] United States Patent
Toyao et al.

(10) Patent No.: US 9,386,689 B2
(45) Date of Patent: *Jul. 5, 2016

(54) CIRCUIT BOARD

(71) Applicant: NEC Corporation, Tokyo (JP)

(72) Inventors: Hiroshi Toyao, Tokyo (JP); Naoki Kobayashi, Tokyo (JP); Noriaki Ando, Tokyo (JP)

(73) Assignee: NEC CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/611,535

(22) Filed: Feb. 2, 2015

(65) Prior Publication Data

US 2015/0144393 A1 May 28, 2015

Related U.S. Application Data

(62) Division of application No. 13/583,485, filed as application No. PCT/JP2011/000905 on Feb. 18, 2011, now Pat. No. 9,000,307.

(30) Foreign Application Priority Data

Mar. 8, 2010 (JP) ................... 2010-051086

(51) Int. Cl.
H05K 1/11 (2006.01)
H05K 1/02 (2006.01)
H01P 3/00 (2006.01)

(52) U.S. Cl.
CPC .............. *H05K 1/0236* (2013.01); *H01P 3/00* (2013.01); *H05K 1/0298* (2013.01); *H05K 1/115* (2013.01); *H05K 1/024* (2013.01); *Y10T 29/49165* (2015.01)

(58) Field of Classification Search
CPC ... H05K 1/0236; H05K 1/0298; H05K 1/115; H01P 3/00
USPC .................................................. 174/266, 262
See application file for complete search history.

(56) References Cited

U.S. PATENT DOCUMENTS 6,262,495 B1 7/2001 Yablonovitch et al.
6,476,771 B1 * 11/2002 McKinzie, III ........ H01Q 1/425
333/134

(Continued)

FOREIGN PATENT DOCUMENTS

JP 7-263908 10/1995
JP 2007-165857 6/2007

(Continued)

OTHER PUBLICATIONS

International Search Report, PCT/JP2011/000905, Mar. 22, 2011.

(Continued)

*Primary Examiner* — Sherman Ng
(74) *Attorney, Agent, or Firm* — Young & Thompson

(57) ABSTRACT

A structure (10) includes at least three conductors (111, 131, 151) that are opposed to each other, a penetration via (101) that penetrates the conductors (111, 131, 151), openings (112, 152) that are formed so as to surround the penetration via (101), and conductor elements (121, 141) that are located in layers other than the layers in which the conductors (111, 131, 151) are located and that are connected to the penetration via (101). The conductor element (121) larger than the opening (112) is opposed to the opening (112) and the conductor element (141) larger than the opening (152) is opposed to the opening (152).

9 Claims, 12 Drawing Sheets

(56) References Cited

U.S. PATENT DOCUMENTS

| | | | |
|---|---|---|---|
| 7,737,899 B1 * | 6/2010 | McKinzie, III | H01Q 1/42 343/700 MS |
| 2007/0090901 A1 * | 4/2007 | Kanno | H01P 7/082 333/219 |
| 2007/0158105 A1 | 7/2007 | Kitao | |
| 2008/0185179 A1 | 8/2008 | Kim et al. | |
| 2008/0266018 A1 | 10/2008 | Han et al. | |
| 2009/0015354 A1 | 1/2009 | Kim et al. | |
| 2009/0315648 A1 * | 12/2009 | Toyao | H01P 1/005 333/238 |
| 2010/0108373 A1 | 5/2010 | Park | |

FOREIGN PATENT DOCUMENTS

| | | |
|---|---|---|
| JP | 2008-193074 | 8/2008 |
| JP | 2008-277755 | 11/2008 |
| JP | 2009-021594 | 1/2009 |

OTHER PUBLICATIONS

Japanese office action dated Aug. 5, 2014; Application No. 2012-504298. Partial translation.

* cited by examiner

CIRCUIT BOARD

TECHNICAL FIELD

The present invention relates to a structure, a circuit board, and a circuit board manufacturing method.

BACKGROUND ART

In recent years, it has been known that the propagation characteristics of electromagnetic waves can be controlled by periodically arranging a conductor pattern having a specific structure (hereinafter, referred to as a metamaterial). In particular, a metamaterial constructed to suppress propagation of electromagnetic waves in a specific frequency band is referred to as an electromagnetic bandgap structure (hereinafter, referred to as an EBG structure). The EBG structure is used as a countermeasure against noise propagating in a circuit board or the like.

An example of such a technique is described in Patent Document 1 (U.S. Pat. No. 6,262,495). FIG. 2 of Patent Document 1 shows a structure, that is, a mushroom-like EBG structure, in which plural island-like conductor elements are arranged over a sheet-like conductive plane and the respective island-like conductor elements are connected to the conductive plane through vias.

Another example of such a technique is described in Patent Document 2 (JP-A-2009-21594). The technique described in Patent Document 2 is a modified example of the mushroom-like EBG structure described in Patent Document 1 and is characterized in that a via corresponding to the stem of a mushroom is formed as a penetration via. Accordingly, it is possible to reduce the number of processes of manufacturing a circuit board (printed circuit board) having the mushroom-like EBG structure.

RELATED DOCUMENT

Patent Document

[Patent Document 1] U.S. Pat. No. 6,262,495
[Patent Document 2] JP-A-2009-21594

DISCLOSURE OF THE INVENTION

In general, a circuit board is formed of multiple layers and includes plural penetration vias. For this reason, plural clearance holes through which the penetration vias pass are formed in conductive layers of the circuit board.

In the structures disclosed in Patent Documents 1 and 2, an EBG structure is constituted in layers interposed between conductive layers (metal layers) opposed with a conductor element (metal plate) interposed therebetween, but the EBG structure is not constructed in the other layers. Accordingly, it is possible to suppress noise between the conductive layers having the EBG structure formed therein, but electromagnetic waves leak to the other layers not having an EBG structure formed therein through the clearance holes, which causes a problem as a noise countermeasure.

The invention is made in consideration of the above-mentioned circumstances and an object thereof is to provide a structure, a circuit board, or a circuit board manufacturing method, in which an EBG structure is constructed between conductive layers using a penetration via in a multi-layered circuit board including at least three conductive layers.

According to an aspect of the invention, there is provided a structure including: at least three first conductors that are opposed to each other; a penetration via that penetrates the first conductors; an opening that is formed in at least one of the first conductors so as to surround the penetration via passing through the first conductors and that insulates the penetration via from the at least one first conductor; and a plurality of second conductors that are located in a plurality of layers other than layers in which the first conductors are located and that are connected to the penetration via, wherein the area of the opening is smaller than the area of any of the second conductors.

According to another aspect of the invention, there is provided a circuit board having a structure, the structure including: at least three first conductors that are opposed to each other; a penetration via that penetrates the first conductors; an opening that is formed in at least one of the first conductors so as to surround the penetration via passing through the first conductors and that insulates the penetration via from the at least one first conductor; and a plurality of second conductors that are located in a plurality of layers other than layers in which the first conductors are located and that are connected to the penetration via, wherein the area of the opening is smaller than the area of any of the second conductors.

According to still another aspect of the invention, there is provided a circuit board manufacturing method including the steps of: (a) arranging at least three first conductors to be opposed to each other, arranging a plurality of second conductors in a plurality of layers other than layers in which the first conductors are located, and stacking the first conductors and the second conductors to be opposed to each other; and (b) forming through-holes that penetrates the first conductors and the second conductors and forming a penetration via that is insulated from at least one of the first conductors and that is connected to the second conductors in the through holes, wherein the area of an opening that is formed in the at least one first conductor insulated from the penetration via in the step of (b) and through which the penetration via passes is smaller than the area of any of the second conductors.

According to the aspects of the invention, it is possible to provide a structure, a circuit board, or a circuit board manufacturing method, in which an EBG structure is constructed between conductive layers using a penetration via in a multi-layered circuit board including at least three conductive layers.

DESCRIPTION OF EMBODIMENTS

Figure 1:
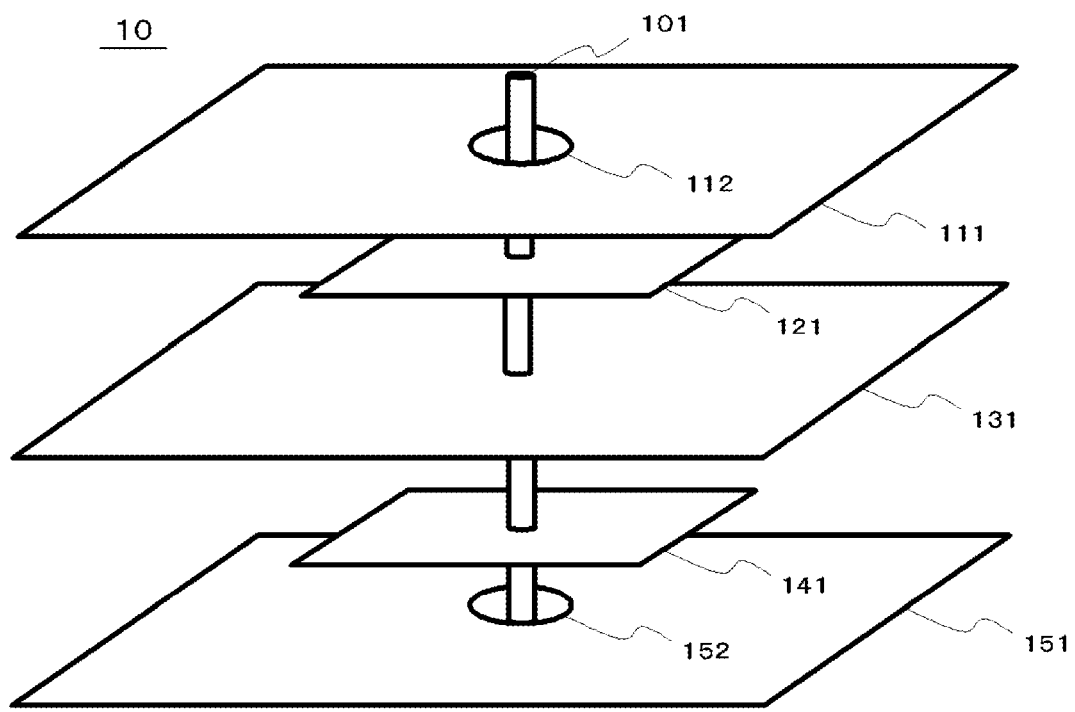
FIG. 1 is a perspective view illustrating an example of a structure according to an embodiment of the invention.

Hereinafter, embodiments of the invention will be described with reference to the accompanying drawings. In all the drawings, like elements are referenced by like reference numerals and will not be repeatedly described.

FIG. 1 is a perspective view illustrating an example of a structure 10 according to an embodiment of the invention. The structure 10 is constructed by various conductive elements formed in a circuit board 100 having at least an A layer 11, a B layer 12, a C layer 13, a D layer 14, and an E layer 15 (see FIG. 9).

The structure 10 includes at least three conductors 111, 131, and 151 (the first conductors) opposed to each other. The structure 10 includes a penetration via 101 that penetrates the conductors 111, 131, and 151 and that is insulated from at least one of the penetrated conductors 111, 131, and 151. The structure 10 includes an opening 112 formed in the conductor 111 insulated from the penetration via 101 and an opening 152 formed in the conductor 151 insulated from the penetration via 101. The structure 10 includes conductor elements 121 and 141 (the second conductors) that are located in plural layers other than the layers in which the conductors 111, 131, and 151 are located and that are connected to the penetration via 101. As shown in the drawing, the penetration via 101 passes through the opening 112 and the opening 152. The area of the opening 112 is smaller than the area of the conductor element 121 or the conductor element 141, and the area of the opening 152 is smaller than the area of the conductor element 121 or the conductor element 141. The opening 112 and the conductor element 121 are opposed to each other without any other conductor interposed therebetween, and the opening 152 and the conductor element 141 are opposed to each other without any other conductor interposed therebetween. A part of the conductor element 121 is opposed to the conductor (a part of the conductor 111) around the opening 112, and a part of the conductor element 141 is opposed to the conductor (a part of the conductor 151) around the opening 152.

The structure 10 may include layers other than the A layer 11, the B layer 12, the C layer 13, the D layer 14, and the E layer 15. For example, a dielectric layer may be located between the respective layers. The structure 10 may further include holes, vias, signal lines, and the like not shown without conflicting the configuration of the invention.

The opening 112 or the opening 152 may not necessarily be hollow, but may be filled with a dielectric. That is, the penetration via 101 may be formed to penetrate the dielectric filled in the opening 112 or the opening 152 and not to come in contact with the conductor 111 or the conductor 151.

In FIG. 1, the conductors 111, 131, and 151 and the conductor elements 121 and 141 are all shown as conductive flat plates. In FIG. 1, the conductors 111, 131, and 151 are shown as flat plates larger than the conductor elements 121 and 141.

When the structure 10 is repeatedly arranged in the circuit board 100, the neighboring conductors 111 are connected. The same is true of the conductors 131 and the conductors 151. The neighboring conductor elements 121 have a gap therebetween and are arranged in an island shape. The same is true of the conductor elements 141. The sizes of the conductors 111, 131, and 151 and the sizes of the conductor elements 121 and 141 have only to be determined without departing from the above-mentioned principle. Accordingly, in the invention, the conductors 111, 131, and 151 may be smaller than the conductor elements 121 and 141.

In the structure 10, it is preferable that the conductor connected to the penetration via 101 among the conductors 111, 131, and 151 function as a ground with a reference potential applied thereto. The conductors should be insulated from the penetration via 101 are provided with an opening through which the penetration via 101 passes.

Here, the penetration via 101 may not penetrate the conductors located at both ends of the conductors 111, 131, and 151. That is, at least a part of the penetration via 101 has only to be formed in the conductor 111 or the conductor 151 located at both ends.

The penetration via 101, the conductor 111, the conductor element 121, the conductor 131, the conductor element 141, and the conductor 151 may be formed of the same material or different materials, as long as they are formed of a conductive material.

It is assumed that the conductor 111 is located in the A layer 11, the conductor element 121 is located in the B layer 12, the conductor 131 is located in the C layer 13, the conductor element 141 is located in the D layer 14, and the conductor 151 is located in the E layer 15. The relative positional relationship of the A layer 11, the B layer 12, the C layer 13, the D layer 14, and the E layer 15 can be changed and thus the relative positional relationship of the conductor 111, the conductor element 121, the conductor 131, the conductor element 141, and the conductor 151 can be changed.

By employing the above-mentioned configuration, a parallel plate including the conductor 111 and the conductor 131 can constitute at least a part of an electromagnetic bandgap structure along with the conductor element 121 and the penetration via 101. A parallel plate including the conductor 131 and the conductor 151 can constitute at least a part of an electromagnetic bandgap structure along with the conductor element 141 and the penetration via 101. By adjusting the gap between the conductor 111 and the conductor element 121, the gap between the conductor element 121 and the conductor 131, the gap between the conductor 131 and the conductor element 141, the gap between the conductor element 141 and the conductor 151, the thickness of the penetration via 101, the mutual gap of the conductor element 121 or the conductor element 141, and the like, it is possible to set the frequency band (bandgap range), in which the propagation of electromagnetic waves should be suppressed, to a desired value. This will be described in more detail later.

In the structure 10 shown in FIG. 1, the conductor 111, the conductor element 121, the conductor 131, the conductor element 141, and the conductor 151 are sequentially arranged in this order from the upper side of the drawing. The conductor 131 is connected to the penetration via 101. The conductor 111 and the conductor 151 are opposed to each other with the conductor 131 interposed therebetween. The conductor 111 has the opening 112 through which the penetration via 101 passes and is insulated from the penetration via 101. The conductor 151 has the opening 152 through which the penetration via 101 passes and is insulated from the penetration via 101.

The conductors 111, 131, and 151 and the conductor elements 121 and 141 are shown in a rectangular shape, but is not limited to this shape and may have various modified examples.

Figure 2:
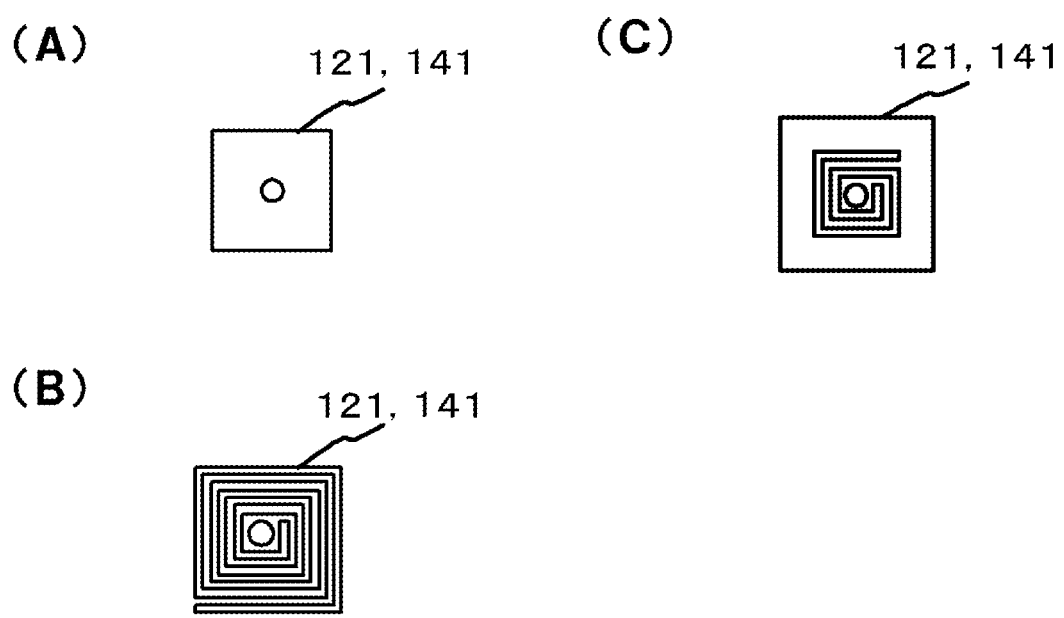
FIG. 2 is a diagram illustrating modified examples of a conductor element.

FIG. 2 is a diagram illustrating modified examples of the conductor element 121 or the conductor element 141 of the structure 10 shown in FIG. 1. FIG. 2 (A) is a top view of the conductor element 121 or the conductor element 141 used in the structure 10 shown in FIG. 1. The conductor element 121 or 141 has a rectangular shape and can constitute a so-called mushroom-like structure 10. Specifically, the penetration via 101 corresponds to the stem part of a mushroom and forms inductance. On the other hand, the conductor element 121 corresponds to the head part of the mushroom and forms capacitance along with the conductor 111 opposed thereto. The conductor element 141 corresponds to the head part of a mushroom and forms capacitance along with the conductor 151 opposed thereto.

The conductor element 121 or the conductor element 141 constituting the mushroom-like structure 10 is not limited to the rectangular shape, but may have a polygonal shape such as a triangular shape or a hexagonal shape or a circular shape.

The mushroom-like EBG structure can be expressed by an equivalent circuit in which a parallel plate is shunted with a serial resonance circuit including the capacitance and the inductance and the resonance frequency of the serial resonance circuit gives the central frequency of a bandgap. Accordingly, it is possible to achieve the fall in the frequency of the bandgap range by causing the conductor element 121 to approach the opposed conductor 111 forming the capacitance to increase the capacitance. However, even when the conductor element 121 is not made to approach the opposed conductor 111, the substantial effect of the invention is not affected at all. It is possible to achieve the fall in the frequency of the bandgap range by causing the conductor element 141 to approach the conductor 151 forming the capacitance to increase the capacitance. Even when the conductor element 141 is not made to approach the opposed conductor 151, the substantial effect of the invention is not affected at all.

FIG. 2(B) is a top view illustrating an example of the conductor element 121 or the conductor element 141 in the structure 10 shown in FIG. 1. The conductor element 121 or the conductor element 141 shown in the drawing is a spiral transmission line formed in a planar direction, where one end thereof is connected to the penetration via 101 and the other end thereof is an open end. By employing the conductor element 121 or the conductor element 141 shown in the drawing, the structure 10 can constitute an open stub type EBG structure in which a microstrip line including the conductor element 121 or the conductor element 141 serves as an open stub. The penetration via 101 forms inductance. On the other hand, the conductor element 121 is electrically coupled to the conductor 111 to form a microstrip line having the conductor 111 as a return path. The conductor element 141 is electrically coupled to the conductor 151 to form a microstrip line having the conductor 151 as a return path.

The open stub type EBG structure can be expressed by an equivalent circuit in which a parallel plate is shunted with a serial resonance circuit including the open stub and the inductance and the resonance frequency of the serial resonance circuit gives the central frequency of a bandgap. Accordingly, by increasing the stub length of the open stub including the conductor element 121 or the conductor element 141, it is possible to achieve a fall in the frequency of the bandgap range.

It is preferable that the conductor element 121 constituting the microstrip line and the opposed conductor 111 be located close to each other. It is preferable that the conductor element 141 constituting the microstrip line and the opposed conductor 151 be located close to each other. This is because as the distance between the conductor element and the opposed plane becomes smaller, the characteristic impedance of the microstrip line becomes lower, thereby widening the bandgap range. However, even when the conductor element 121 is not made to approach the opposed conductor 111, the substantial effect of the invention is not affected at all. Even when the conductor element 141 is not made to approach the opposed conductor 151, the substantial effect of the invention is not affected at all.

FIG. 2(C) is a top view illustrating an example of the conductor element 121 or the conductor element 141 in the structure 10 shown in FIG. 1. The conductor element 121 or the conductor element 141 is a rectangular conductor and has an opening. In the opening, a spiral inductor of which an end is connected to the edge of the opening and the other end is connected to the penetration via 101 is formed. By employing the conductor element 121 or the conductor element 141 shown in the drawing, the structure 10 can constitute an inductance-increased EBG structure in which inductance is increased by forming an inductor in the head part of a mushroom in a mushroom-like EBG structure as a basic structure. More specifically, the conductor element 121 corresponds to the head part of a mushroom and forms capacitance along with the opposed conductor 111. The conductor element 141 corresponds to the head part of the mushroom and forms capacitance along with the opposed conductor 151.

The inductance-increased EBG structure can be expressed by an equivalent circuit in which a parallel plate is shunted with a serial resonance circuit including the capacitance and the inductance and the resonance frequency of the serial resonance circuit gives the central frequency of a bandgap. Accordingly, by causing the conductor element 121 to approach the conductor 111 forming the capacitance to increase the capacitance or extending the length of the inductor to increase the inductance, it is possible to achieve a fall in the frequency of the bandgap range. However, even when the conductor element 121 is not made to approach the opposed conductor 111, the substantial effect of the invention is not affected at all. By causing the conductor element 141 to approach the conductor 151 forming the capacitance to increase the capacitance or extending the length of the inductor to increase the inductance, it is possible to achieve a fall in the frequency of the bandgap range. However, even when the conductor element 141 is not made to approach the opposed conductor 151, the substantial effect of the invention is not affected at all.

Figure 3:
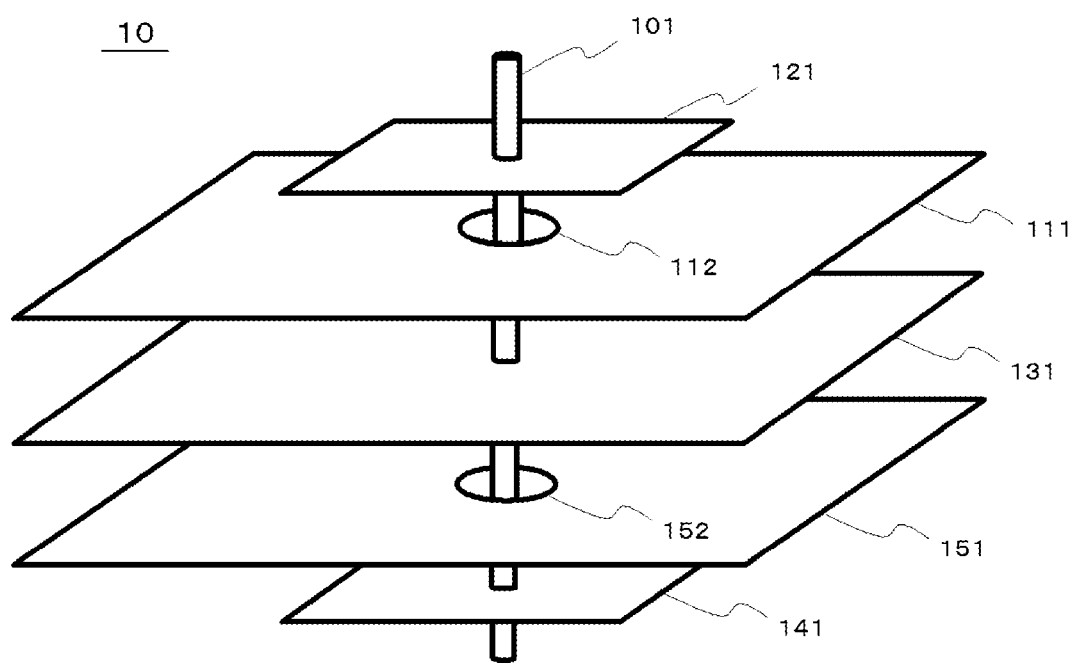
FIG. 3 is a perspective view illustrating an example of a structure according to the embodiment of the invention.

FIG. 3 is a perspective view illustrating an example of the structure 10 according to this embodiment. In the structure 10 shown in FIG. 3, the conductor 111 or the conductor 151 located at both ends of the conductors 111, 131, and 151 has the opening 112 or the opening 152 through which the penetration via 101 passes and is insulated from the penetration via 101. The conductor 131 located therebetween is connected to the penetration via 101. The conductor element 121 is located above the conductor 111 and the conductor element 141 is located below the conductor 151.

The structure shown in FIG. 3 is a modified example of a mushroom-like EBG structure. Specifically, the penetration via 101 corresponds to the stem part of a mushroom and forms inductance. On the other hand, the conductor element 121 or the conductor element 141 corresponds to the head part of the mushroom and forms capacitance along with the opposed conductor 111 or the opposed conductor 151.

Similarly to the mushroom-like EBG structure, the structure shown in FIG. 3 can be expressed by an equivalent circuit in which a parallel plate is shunted with a serial resonance circuit including the capacitance and the inductance and the resonance frequency of the serial resonance circuit gives the central frequency of a bandgap. Accordingly, it is possible to achieve the fall in the frequency of the bandgap range by causing the conductor element 121 or the conductor element 141 to approach the conductor 111 or the conductor 151 forming the capacitance to increase the capacitance. However, even when the conductor element 121 or the conductor element 141 is not made to approach the opposed conductor 111 or the opposed conductor 151, the substantial effect of the invention is not affected at all.

The conductor element 121 or the conductor element 141 in the structure 10 shown in FIG. 3 may have the shape shown in FIG. 2(B). Here, the structure 10 similarly has the characteristics of the above-mentioned open stub type EBG structure. The conductor element 121 or the conductor element 141 in the structure 10 shown in FIG. 3 may have the shape shown in FIG. 2(C). Here, the structure 10 similarly has the above-mentioned characteristics of the inductance-increased EBG structure.

Figure 4:
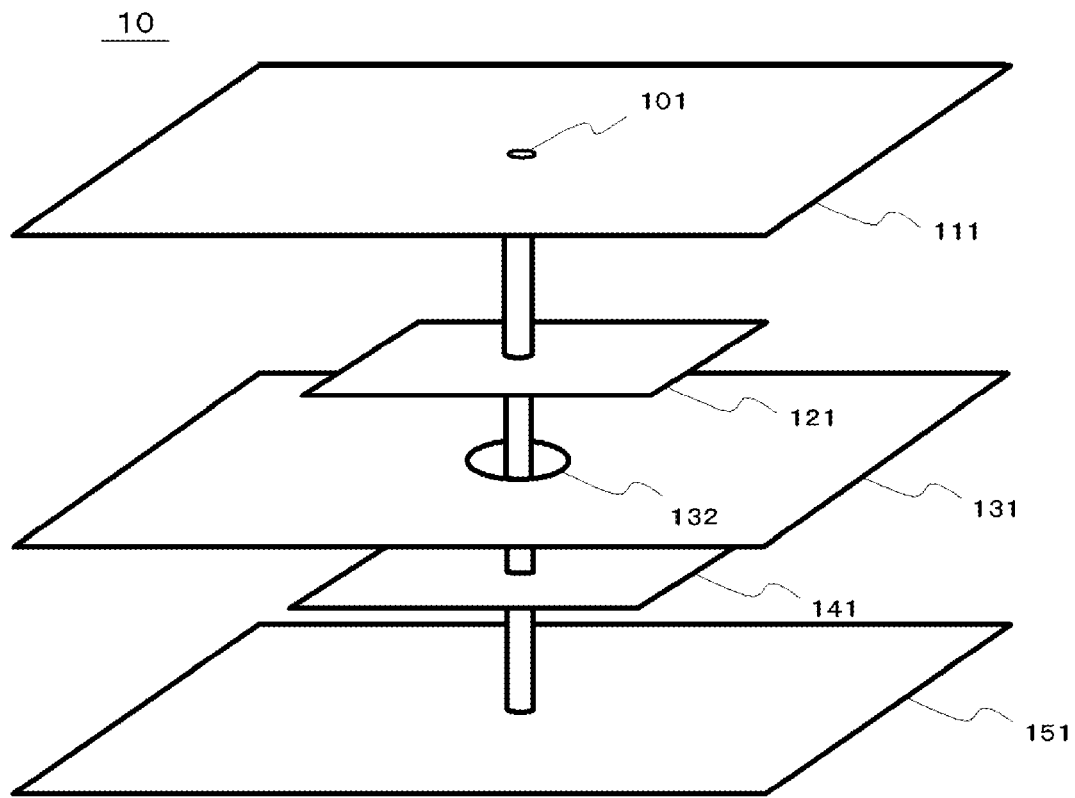
FIG. 4 is a perspective view illustrating an example of a structure according to the embodiment of the invention.

FIG. 4 is a perspective view illustrating the structure 10 according to this embodiment. In the structure 10 shown in FIG. 4, the conductor 111, the conductor element 121, the conductor 131, the conductor element 141, and the conductor 151 are sequentially arranged in this order from the upper side of the drawing. The conductors 111 and 151 located at both ends of the conductors 111, 131, and 151 are connected to the penetration via 101. The conductor 131 located therebetween has the opening 132 through which the penetration via 101 passes and is insulated from the penetration via 101. The conductor element 121 is located between the conductor 111 and the conductor 131 and the conductor element 141 is located between the conductor 131 and the conductor 151.

The structure shown in FIG. 4 is a modified example of a mushroom-like EBG structure. Specifically, the penetration via 101 corresponds to the stem part of a mushroom and forms inductance. On the other hand, the conductor element 121 or the conductor element 141 corresponds to the head part of the mushroom and forms capacitance along with the opposed conductor 131.

Similarly to the mushroom-like EBG structure, the structure shown in FIG. 4 can be expressed by an equivalent circuit in which a parallel plate is shunted with a serial resonance circuit including the capacitance and the inductance and the resonance frequency of the serial resonance circuit gives the central frequency of a bandgap. Accordingly, it is possible to achieve the fall in the frequency of the bandgap range by causing the conductor element 121 or the conductor element 141 to approach the conductor 131 forming the capacitance to increase the capacitance. However, even when the conductor element 121 or the conductor element 141 is not made to approach the opposed conductor 131, the substantial effect of the invention is not affected at all.

The conductor element 121 or the conductor element 141 in the structure 10 shown in FIG. 4 may have the shape shown in FIG. 2(B). Here, the structure 10 similarly has the characteristics of the open stub type EBG structure described with reference to FIG. 2(B).

The conductor element 121 or the conductor element 141 in the structure 10 shown in FIG. 4 may have the shape shown in FIG. 2(C). Here, the structure 10 similarly has the characteristics of the inductance-increased EBG structure described with reference to FIG. 2(C).

Figure 5:
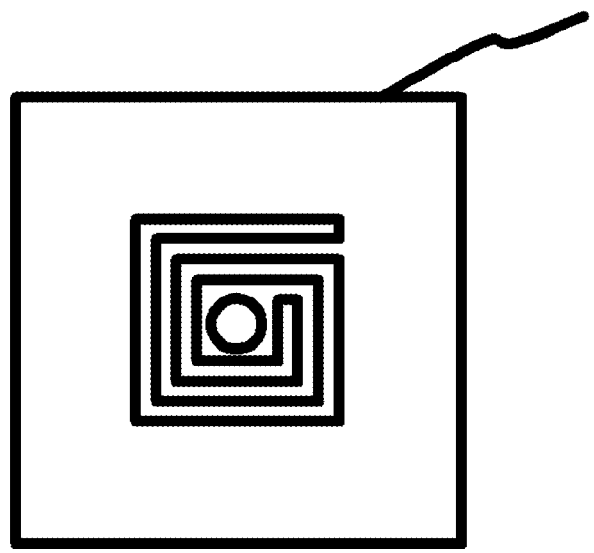
FIG. 5 is a diagram illustrating modified examples of a conductor.

FIG. 5 is a top view illustrating an example of the conductor 111 or the conductor 151 in the structure 10 shown in FIG. 4. The conductor 111 or the conductor 151 shown in the drawing has an opening. In the opening, a spiral inductor of which an end is connected to the edge of the opening and the other end is connected to the penetration via 101 is formed. The conductor 111 or the conductor 151 shown in FIG. 5 is used along with the conductor element 121 or the conductor element 141 shown in FIG. 2(A). By employing the conductor element 121 or the conductor element 141 shown in FIG. 2(A) along with the conductor 111 or the conductor 151 shown in FIG. 5, the structure 10 can constitute an inductance-increased EBG structure in which inductance is increased by forming an inductor in the conductor 111 or the conductor 151 in a mushroom-like EBG structure as a basic structure. More specifically, the conductor element 121 corresponds to the head part of a mushroom and forms capacitance along with the opposed conductor 131. The conductor element 141 corresponds to the head part of the mushroom and forms capacitance along with the opposed conductor 131. On the other hand, the penetration via 101 corresponds to the stem part of the mushroom and forms inductance along with the inductor formed in the conductor 111 or the conductor 151.

The inductance-increased EBG structure can be expressed by an equivalent circuit in which a parallel plate is shunted with a serial resonance circuit including the capacitance and the inductance and the resonance frequency of the serial resonance circuit gives the central frequency of a bandgap. Accordingly, by causing the conductor element 121 or the conductor element 141 to approach the conductor 131 forming the capacitance to increase the capacitance or extending the length of the inductor to increase the inductance, it is possible to achieve a fall in the frequency of the bandgap range. However, even when the conductor element 121 or the conductor element 141 is not made to approach the opposed conductor 131, the substantial effect of the invention is not affected at all.

Figure 6:
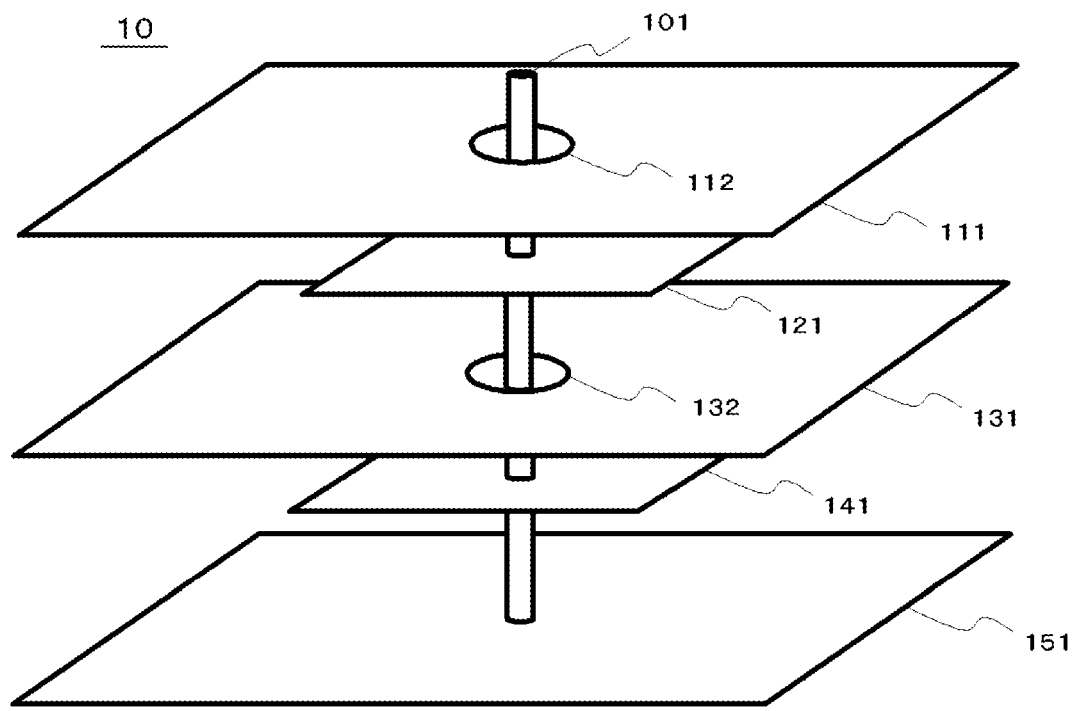
FIG. 6 is a perspective view illustrating an example of a structure according to the embodiment of the invention.

FIG. 6 is a perspective view illustrating an example of the structure 10 according to this embodiment. In the structure 10 shown in FIG. 6, the conductor 151 is connected to the penetration via 101. The conductor 111 and the conductor 131 are located on the same side with respect to the conductor 151. The conductor 111 has the opening 112 through which the penetration via 101 passes and is insulated from the penetration via 101. The conductor 131 has the opening 132 through which the penetration via 101 passes and is insulated from the penetration via 101. The conductor element 121 is located between the conductor 111 and the conductor 131, and the conductor element 141 is located between the conductor 131 and the conductor 151. The conductor element 121 and the conductor element 141 are connected to the penetration via 101.

By employing the configuration shown in FIG. 6, the number of layers (the B layer 12 and the D layer 14) in which the conductor element 121 or the conductor element 141 is located is equal to the number of layers (the A layer 11 and the C layer 13) in which the conductor 111 or the conductor 131 is located. More specifically, the number of the conductor elements 121 is equal to the number of the openings 112 formed in the conductors 111. The number of the conductor element 141 is equal to the number of the opening 132 formed in the conductors 131.

The structure 10 shown in FIG. 6 is a modified example of a mushroom-like EBG structure. Specifically, the penetration via 101 corresponds to the stem part of a mushroom and forms inductance. On the other hand, the conductor element 121 corresponds to the head part of the mushroom and forms capacitance along with the opposed conductor 111. The conductor element 141 corresponds to the head part of the mushroom and forms capacitance along with the opposed conductor 131.

Similarly to the mushroom-like EBG structure, the structure shown in FIG. 6 can be expressed by an equivalent circuit in which a parallel plate is shunted with a serial resonance circuit including the capacitance and the inductance and the resonance frequency of the serial resonance circuit gives the central frequency of a bandgap. Accordingly, it is possible to achieve the fall in the frequency of the bandgap range by causing the conductor element 121 to approach the conductor 111 forming the capacitance to increase the capacitance. However, even when the conductor element 121 is not made to approach the opposed conductor 111, the substantial effect of the invention is not affected at all. It is possible to achieve the fall in the frequency of the bandgap range by causing the conductor element 141 to approach the conductor 131 forming the capacitance to increase the capacitance. Even when the conductor element 141 is not made to approach the opposed conductor 131, the substantial effect of the invention is not affected at all.

In the structure 10 shown in FIG. 6, the conductor element 121 is arranged to oppose the bottom surface of the conductor 111, but may be arranged to oppose the top surface of the conductor 111. In the structure 10 shown in FIG. 6, the conductor element 141 is arranged to oppose the bottom surface of the conductor 131, but may be arranged to oppose the top surface of the conductor 131.

The conductor elements 121 and 141 in the structure 10 shown in FIG. 6 may have the shape shown in FIG. 2(B). Here, the structure 10 similarly has the above-mentioned characteristics of the open stub type EBG structure.

The conductor elements 121 and 141 in the structure 10 shown in FIG. 6 may have the shape shown in FIG. 2(C). Here, the structure 10 similarly has the characteristics of the inductance-increased EBG structure described with reference to FIG. 2(C). In the structure 10 shown in FIG. 6, the shape shown in FIG. 5 may be employed as an example of the conductor 151. At this time, the structure 10 similarly has the characteristics of the inductance-increased EBG structure.

Figure 7:
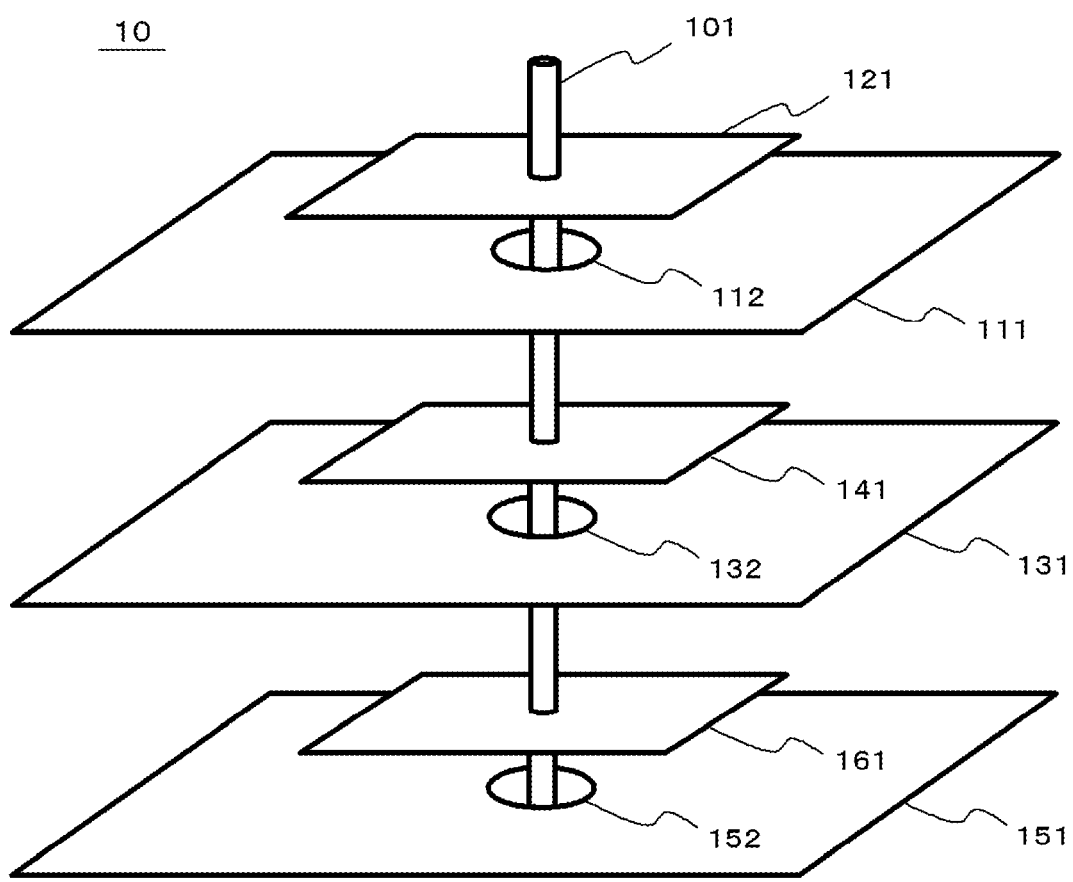
FIG. 7 is a perspective view illustrating an example of a structure according to the embodiment of the invention.

FIG. 7 is a perspective view illustrating an example of the structure 10 according to this embodiment. In the structure 10 shown in FIG. 7, all of the conductor 11, the conductor 131, and the conductor 151 are insulated from the penetration via 101. The conductor 111 has an opening 112 through which the penetration via 101 passes. The conductor element 121 is arranged to oppose to the opening 112. The conductor 131 has an opening 132 through which the penetration via 101 passes. The conductor element 141 is arranged to oppose to the opening 132. The conductor 151 has an opening 152 through which the penetration via 101 passes. The conductor element 161 is arranged to oppose to the opening 152. It is assumed that the conductor element 161 is located in the F layer 16.

By employing the configuration shown in FIG. 7, the number of layers (the B layer 12, the D layer 14, and the F layer 16) in which the conductor element 121, the conductor element 141, or the conductor element 161 is located is equal to the number of layers (the A layer 11, the C layer 13, the E layer 15) in which the conductor 111, the conductor 131, or the conductor 151 is located. More specifically, the number of the conductor elements 121 is equal to the number of the openings formed in the conductors 111. The number of the conductor elements 141 is equal to the number of the openings formed in the conductors 131. The number of the conductor elements 161 is equal to the number of the openings formed in the conductors 151.

The structure 10 shown in FIG. 7 is a modified example of a mushroom-like EBG structure. Specifically, the penetration via 101 corresponds to the stem part of a mushroom and forms inductance. On the other hand, the conductor element 121 corresponds to the head part of the mushroom and forms capacitance along with the opposed conductor 111. The conductor element 141 corresponds to the head part of the mushroom and forms capacitance along with the opposed conductor 131. The conductor element 161 corresponds to the head part of the mushroom and forms capacitance along with the opposed conductor 151. Since the conductor element 121 and the conductor 111 are opposed to each other to form capacitance and the opening 112 formed in the conductor 111 is included in the region in which both are opposed to each other, it is possible to almost prevent the leakage of noise from the opening 112. Since the conductor element 161 and the conductor 151 are opposed to each other to form capacitance and the opening 152 formed in the conductor 151 is included in the region in which both are opposed to each other, it is possible to almost prevent the leakage of noise from the opening 152.

Similarly to the mushroom-like EBG structure, the structure shown in FIG. 7 can be expressed by an equivalent circuit in which a parallel plate is shunted with a serial resonance circuit including the capacitance and the inductance and the resonance frequency of the serial resonance circuit gives the central frequency of a bandgap. Accordingly, it is possible to achieve the fall in the frequency of the bandgap range by causing the conductor element 121 to approach the conductor 111 forming the capacitance to increase the capacitance. However, even when the conductor element 121 is not made to approach the opposed conductor 111, the substantial effect of the invention is not affected at all. It is possible to achieve the fall in the frequency of the bandgap range by causing the conductor element 141 to approach the conductor 131 forming the capacitance to increase the capacitance. Even when the conductor element 141 is not made to approach the opposed conductor 131, the substantial effect of the invention is not affected at all. It is possible to achieve the fall in the frequency of the bandgap range by causing the conductor element 161 to approach the conductor 151 forming the capacitance to increase the capacitance. Even when the conductor element 161 is not made to approach the opposed conductor 151, the substantial effect of the invention is not affected at all.

In the structure 10 shown in FIG. 7, the conductor element 121 is arranged to oppose the top surface of the conductor 111, but may be arranged to oppose the bottom surface of the conductor 111. In the structure 10 shown in FIG. 7, the conductor element 141 is arranged to oppose the top surface of the conductor 131, but may be arranged to oppose the bottom surface of the conductor 131. In the structure 10 shown in FIG. 7, the conductor element 161 is arranged to oppose the top surface of the conductor 151, but may be arranged to oppose the bottom surface of the conductor 151.

The conductor elements 121, 141, and 161 in the structure 10 shown in FIG. 7 may have the shape shown in FIG. 2(B). Here, the structure 10 similarly has the above-mentioned characteristics of the open stub type EBG structure.

The conductor elements 121, 141, and 161 in the structure 10 shown in FIG. 7 may have the shape shown in FIG. 2(C). Here, the structure 10 similarly has the characteristics of the inductance-increased EBG structure described with reference to FIG. 2(C).

Figure 8:
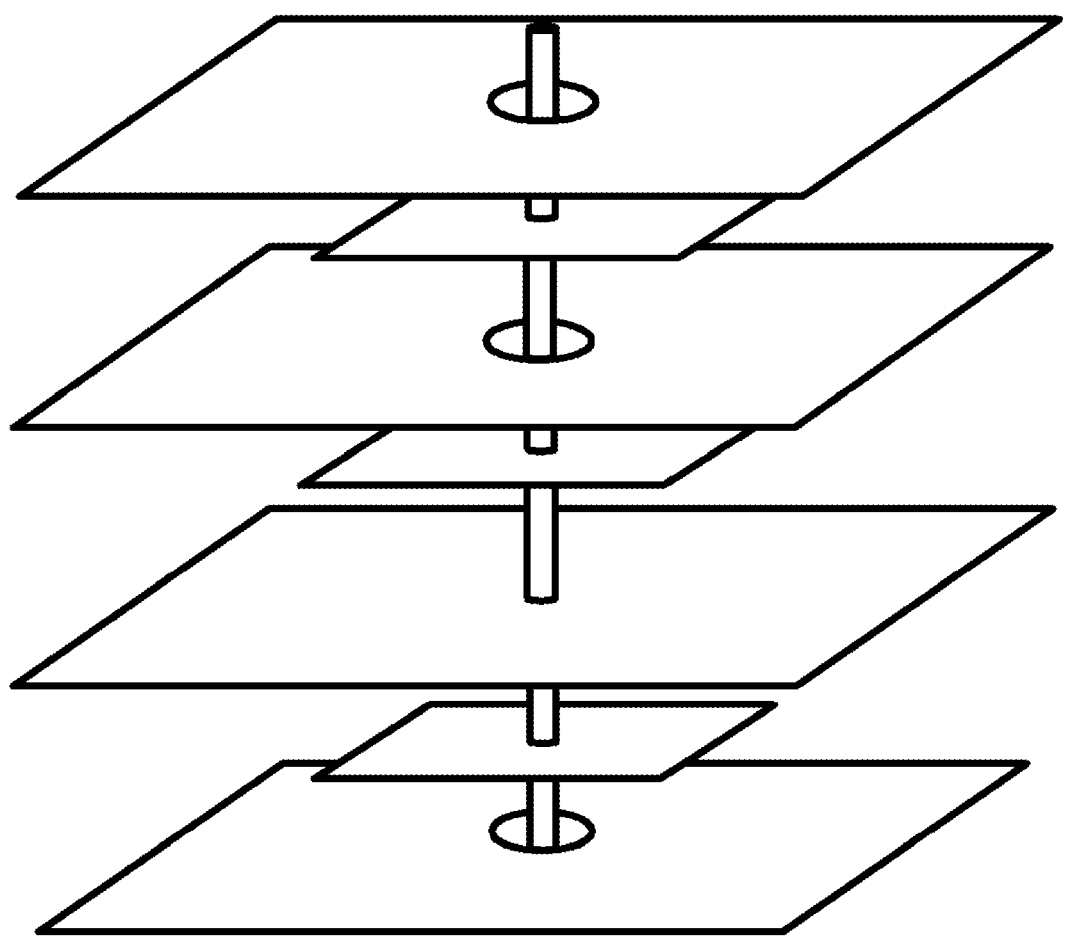
FIG. 8 is a perspective view illustrating an example of a structure constructed by combining the structures according to the embodiment of the invention.

The structures 10 constituting the EBG structure using three sheet-like conductors 111, 131, and 151 and the penetration via 101 are described above with reference to FIGS. 1 to 7. Another structure constituting the EBG structure using four or more sheet-like conductors and a penetration via may be constructed by combining the structures 10 shown in FIGS. 1 to 7. For example, the structure shown in FIG. 8 is obtained by combining the structures shown in FIGS. 1 to 6. The individual elements are the same as described above and thus will not be repeated.

All the structures 10 described with reference to FIGS. 1 to 7 include the penetration via 101 as a constituent. The structures 10 are manufactured through the following manufacturing processes.

First, (a) the conductor 111, the conductor 131, the conductor 151, the conductor element 121, and the conductor element 141 are stacked to oppose each other and to be located in different layers. Then, (b) a through-hole is formed which penetrates the conductor 111, the conductor 131, the conductor 151, the conductor element 121, and the conductor element 141 and the penetration via 101 that is insulated from at least one of the conductors 111, 131, and 151 and that connects the conductor element 121 and the conductor element 141 is formed in the through-hole. Here, the constituents are arranged in the process of (a) so that at least one conductor element is opposed to the openings that is disposed in the conductor insulated from the penetration via 101 formed through the process of (b) and through which the penetration via 101 passes.

When there is any constituent not shown, the constituent is preferably arranged appropriately in the process of (a). In the process of (b), the method of forming the through-hole is not particularly limited as long as it is applicable, and for example, the through-hole may be formed with a drill. In the process of (b), the method of forming the penetration via 101 is not particularly limited as long as it is applicable, and for example, the connection member may be formed by plating the inner surface of the through-hole.

Figure 9:
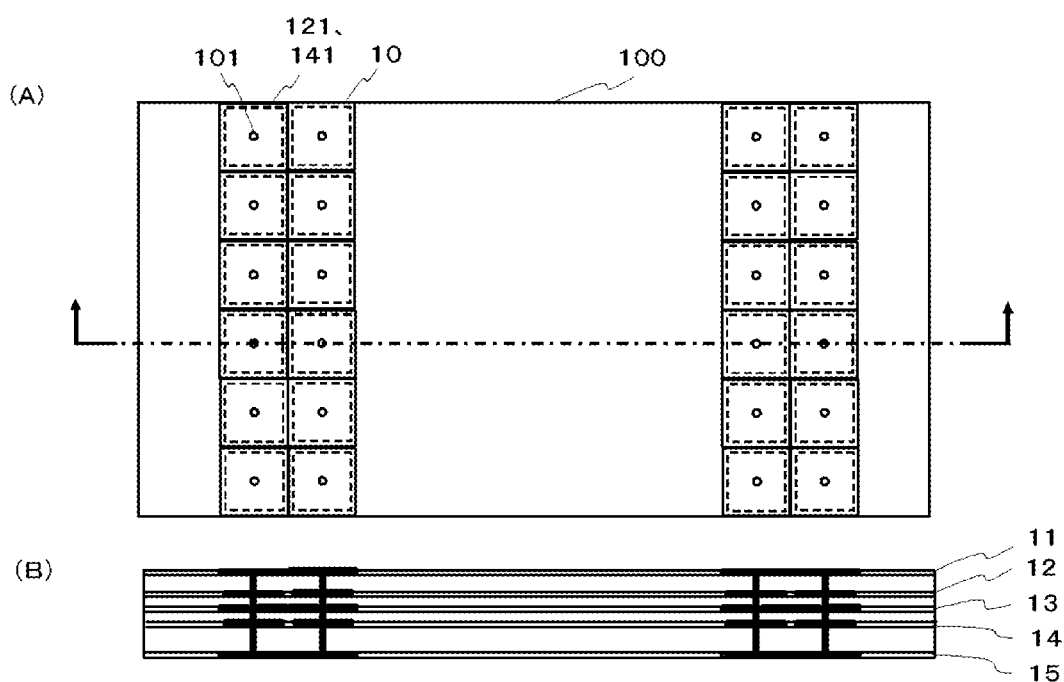
FIG. 9 shows a top view and a cross-sectional view of a circuit board according to an embodiment of the invention.

FIG. 9 shows a top view and a cross-sectional view of the circuit board 100 according to this embodiment. More specifically, FIG. 9(A) is a top view of the circuit board 100 and FIG. 9(B) is a cross-sectional view taken along the indicated sectional line in FIG. 9(A). In FIG. 9(A), squares indicated by dotted lines represent the conductor elements 121 formed in the B layer 12 or the conductor elements 141 formed in the D layer 14 in each of the structures 10 which are repeatedly arranged. In FIG. 9(A), circles in the squares indicated by dotted lines represent the penetration via 101 formed in each of the structures 10 which are repeatedly arranged. In FIG. 9, it is assumed that the structure 10 described with reference to FIG. 5 is repeatedly arranged and the structures 10 are illustrated with black in FIG. 9(B).

As shown in FIG. 9, the conductor elements 121 located in the B layer 12 are connected to different penetration vias 101. The conductor elements 141 located in the D layer 14 are connected to different penetration vias 101.

The A layer 11, the B layer 12, the C layer 13, the D layer 14, and the E layer 15 may further include constituents other than the constituents shown in the drawing, such as transmission lines transmitting electrical signals. The circuit board 100 may include layers other than the A layer 11, the B layer 12, the C layer 13, the D layer 14, and the E layer 15, and these layers may include the constituents other than the above-mentioned constituents, such as transmission lines. Here, when the transmission lines are disposed in a region in which the structure 10 is repeatedly arranged in the circuit board 100 and in the vicinity of the region, the characteristics of the EBG structures constituted by the structures 10 vary and thus it is preferable to avoid this arrangement.

In the circuit board 100, it is possible to suppress the propagation of electromagnetic waves of the bandgap range in the region in which the structure 10 is repeatedly arranged. That is, the structures 10 have only to be arranged to surround a noise source generating the electromagnetic waves of the bandgap range or elements to be protected from the electromagnetic waves of a specific frequency band and the arrangement pattern thereof may include various examples.

Figure 10:
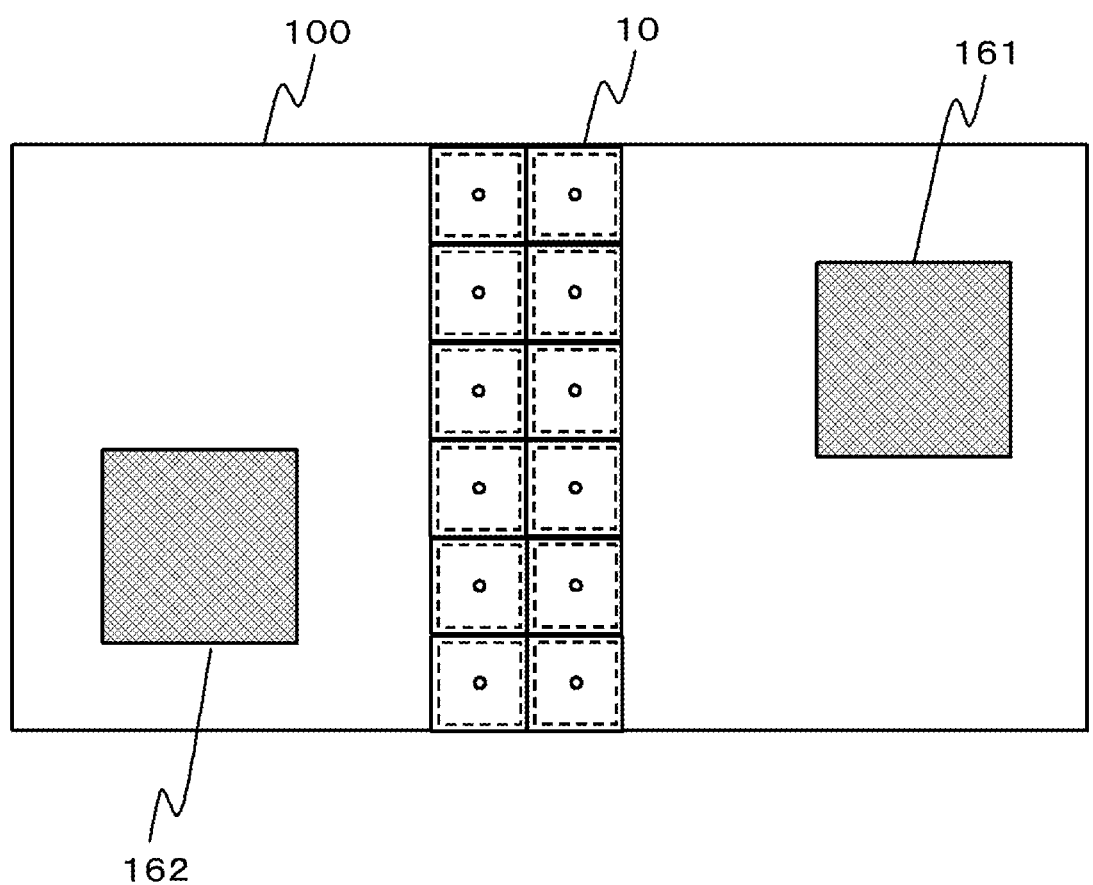
FIG. 10 is a diagram illustrating an arrangement pattern of a structure which can be employed by the circuit board.
Figure 11:
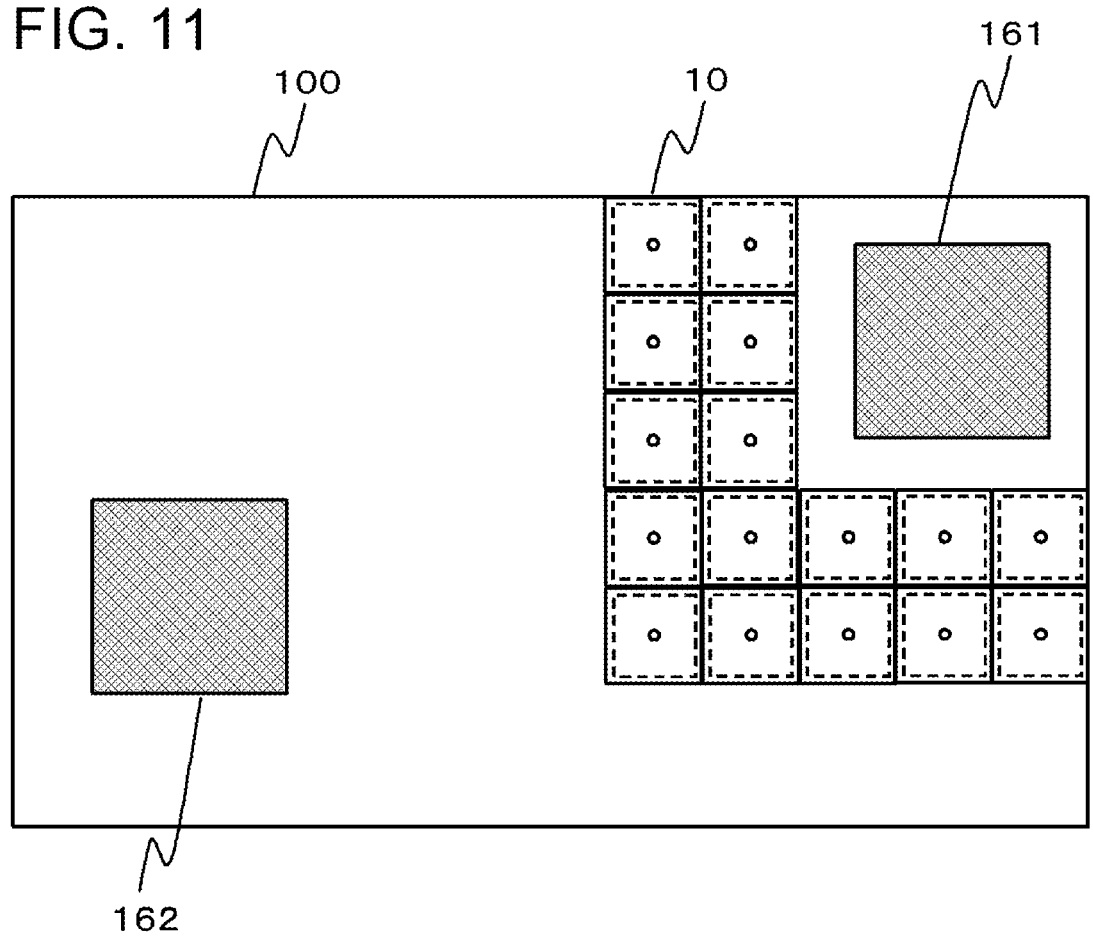
FIG. 11 is a diagram illustrating an arrangement pattern of a structure which can be employed by the circuit board.
Figure 12:
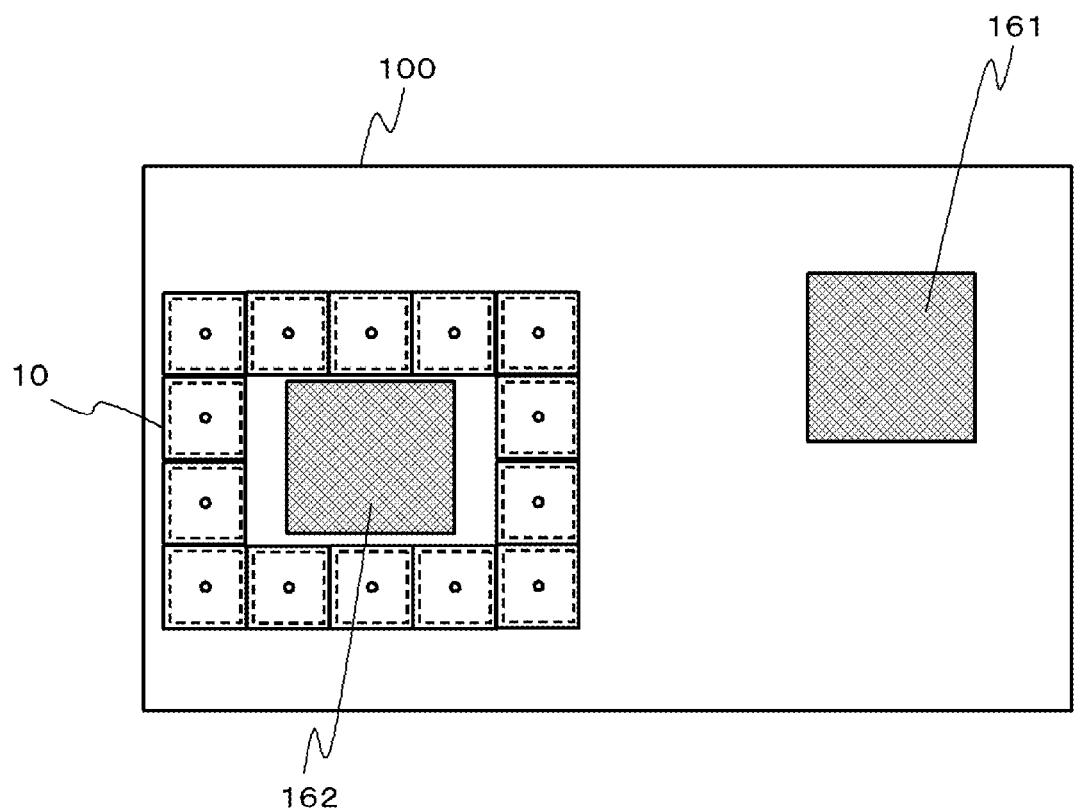
FIG. 12 is a diagram illustrating an arrangement pattern of a structure which can be employed by the circuit board.

FIGS. 10 to 12 are diagrams illustrating the arrangement patterns of the structures 10 which can be employed by the circuit board 100. Here, the meshed members in FIGS. 10 to 12 are a semiconductor package 161 and a semiconductor package 162. As shown in FIG. 10, the structures 10 may be arranged in a band shape between the semiconductor package 161 and the semiconductor package 162. The structures 10 may be arranged to surround the semiconductor package 161 as shown in FIG. 11 or the structures 10 may be arranged to surround the semiconductor package 162 as shown in FIG. 12.

Even when electromagnetic waves to be suppressed propagate in any direction, it is possible to more effectively suppress the propagation of the electromagnetic waves by arranging the plural structures 10 so as to pass the electromagnetic waves therethrough. Accordingly, like the arrangement pattern shown in FIG. 10 or 11, the arrangement pattern in which the plural structures 10 are arranged in parallel in the direction from one semiconductor package to the other semiconductor package is more desirable than the arrangement pattern shown in FIG. 12.

The effects of this embodiment will be described below. The structure 10 can constitute the EBG structures by the use of the conductors 111, 131, and 151, the conductor elements 121 and 141, and the penetration via 101. Accordingly, in the structure 10, it is possible to suppress noise propagating in a first parallel plate including the conductor 111 and the conductor 131 and noise propagating in a second parallel plate including the conductor 131 and the conductor 151. Accordingly, even when there is noise leaking from the first parallel plate to the second parallel plate or noise leaking from the second parallel plate to the first parallel plate, it is possible to suppress such noise.

In the circuit board 100, it is possible to suppress noise propagating between the A layer 11 and the C layer 13 and noise propagating between the C layer 13 and the E layer 15 by arranging the structures 10 in a region in which noise should be prevented from propagating. Accordingly, even when noise propagating between the A layer 11 and the C layer 13 leaks into the layer between the C layer 13 and the E layer 15 through the C layer 13, or even when noise leaks in the reverse direction, it is possible to suppress such noise.

All the structures 10 used in this embodiment include the penetration via 101. Accordingly, compared with a case in which a non-penetration via is employed, it is possible to reduce the number of manufacturing processes and to reduce the manufacturing cost.

While the embodiment of the invention has been described with reference to the accompanying drawings, the embodiment is only an example of the invention, and various configurations not described above may be employed.

For example, the number of the first conductors (the conductors 111, 131, and 151 in the above-mentioned embodiment) of the invention is set to three in the above-mentioned embodiment, but may be set to four or more. As the number of the first conductors increases, the number of layers of the structure or the circuit board increases. Here, when the number of parallel plates in which the propagation of noise should be suppressed increases, the number of layers in which the conductor elements corresponding to the second conductors of the invention should be formed may be made to increase.

In any structure described in the above-mentioned embodiment, it has been stated that at least one conductor element is opposed to the respective openings through which the penetration via, but the invention is not limited to this configuration. That is, some of the conductor elements may be removed from the above-mentioned structure. It should be noted that the EBG structure is not constructed between the parallel plates in which the conductor elements are moved.

In the above-mentioned embodiment, all the structures 10 have a single penetration via 101, but the invention is not limited to this configuration. That is, a configuration in which plural structures 10 described in the above-mentioned embodiment are connected may be considered as a single structure. Accordingly, in this structure, plural penetration vias are repeatedly arranged and the conductor elements located in the same layer are connected to different connection members, respectively.

The above-mentioned embodiment and the modified examples thereof can be combined without conflicting each other. In the above-mentioned embodiment and the modified examples, the functions and the like of the constituents are specifically described above, but the functions and the like can be modified in various forms without departing from the concept of the invention.

Priority is claimed on Japanese Patent Application No. 2010-051086, filed Mar. 8, 2010, the content of which is incorporated herein by reference.

The invention claimed is:

1. A circuit board comprising: a plurality of structures, each of the structures having, at least three first conductors that are opposed to each other; penetration vias that penetrate each of the first conductors; an opening that is formed in at least one of the first conductors so as to surround the penetration via passing through the first conductors and that insulates the penetration via from the at least one first conductor; and a plurality of second conductors that are located in a plurality of layers other than layers in which the first conductors are located and that are connected to the penetration via, wherein the second conductors are transmission lines, where one ends thereof are connected to each of the penetration vias and the other ends thereof are open ends; and wherein the first conductors of neighboring ones of said plurality of structures are directly connected.

2. The circuit board according to claim 1, wherein one of the first conductors located at both ends of the first conductors is connected to the penetration via, and
    wherein all the other first conductors have the opening formed therein and are insulated from the penetration via.

3. The circuit board according to claim 1, wherein at least two of the other first conductors are located on the same side with respect to the one of the first conductors connected to the penetration via, and
    wherein all the other first conductors have the opening formed therein and are insulated from the penetration via.

4. The circuit board according to claim 1, wherein at least two of the other first conductors are opposed to each other with the one of the first conductors connected to the penetration via interposed therebetween, and
    wherein all the other first conductors have the opening formed therein and are insulated from the penetration via.

5. The circuit board according to claim 1, wherein all the first conductors have the opening formed therein and are insulated from the penetration via.

6. The circuit board according to claim 1, wherein a plurality of the penetration vias are repeatedly arranged, and
    wherein the plurality of second conductors located in the same layer are connected to the different penetration vias, respectively.

7. The circuit board according to claim 1, wherein the openings are opposed to at least one of the second conductors.

8. The circuit board according to claim 1, wherein the number of the second conductors is equal to the number of the openings.

9. The circuit board according to claim 1, wherein each of a plurality of parallel plates constructed by opposing the at least three first conductors to each other constitutes an electromagnetic bandgap structure along with the penetration via and the second conductors.

* * * * *